(12) United States Patent
Morita et al.

(10) Patent No.: US 8,489,264 B2
(45) Date of Patent: Jul. 16, 2013

(54) BATTERY MEASURING DEVICE, BATTERY CONTROL SYSTEM AND VEHICLE

(75) Inventors: Tomokazu Morita, Funabashi (JP); Norio Takami, Yokohama (JP); Hiroki Inagaki, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 436 days.

(21) Appl. No.: 12/726,606

(22) Filed: Mar. 18, 2010

(65) Prior Publication Data

US 2010/0250038 A1    Sep. 30, 2010

(30) Foreign Application Priority Data

Mar. 30, 2009   (JP) .................................. 2009-082993

(51) Int. Cl.
*B60L 11/00*   (2006.01)

(52) U.S. Cl.
USPC ............................................ 701/22; 320/136

(58) Field of Classification Search
None
See application file for complete search history.

(56) References Cited

U.S. PATENT DOCUMENTS

2009/0001992 A1*   1/2009   Tsuchiya ...................... 324/426

FOREIGN PATENT DOCUMENTS

| JP | 2000-133322 | 5/2000 |
|----|-------------|--------|
| JP | 2001-119862 | 4/2001 |
| JP | 2004-264076 | 9/2004 |
| JP | 2006-221821 | 8/2006 |

OTHER PUBLICATIONS

Japanese Office Action issued Jul. 12, 2011, in Patent Application No. 2009-082993 (with English-language translation).

* cited by examiner

*Primary Examiner* — James Trammell
*Assistant Examiner* — Jerrah Edwards
(74) *Attorney, Agent, or Firm* — Oblon, Spivak, McClelland, Maier & Neustadt, L.L.P.

(57) ABSTRACT

A battery measuring device includes a temperature measuring unit which measures temperature T1 of a secondary battery, a resistance measuring unit which measures an AC resistance value and a DC pulse resistance value of a first discharging period of the secondary battery at the temperature T1, and an estimating unit in which an electric resistance Re1 and a reaction resistance Rc1 of the secondary battery at the temperature T1 are considered as, Re1=AC resistance value Rc1=DC pulse resistance value of the first discharging period−AC resistance value, and which estimates at least an internal resistance of the secondary battery using the temperature T1, electric resistance Re1 and reaction resistance Rc1.

10 Claims, 6 Drawing Sheets

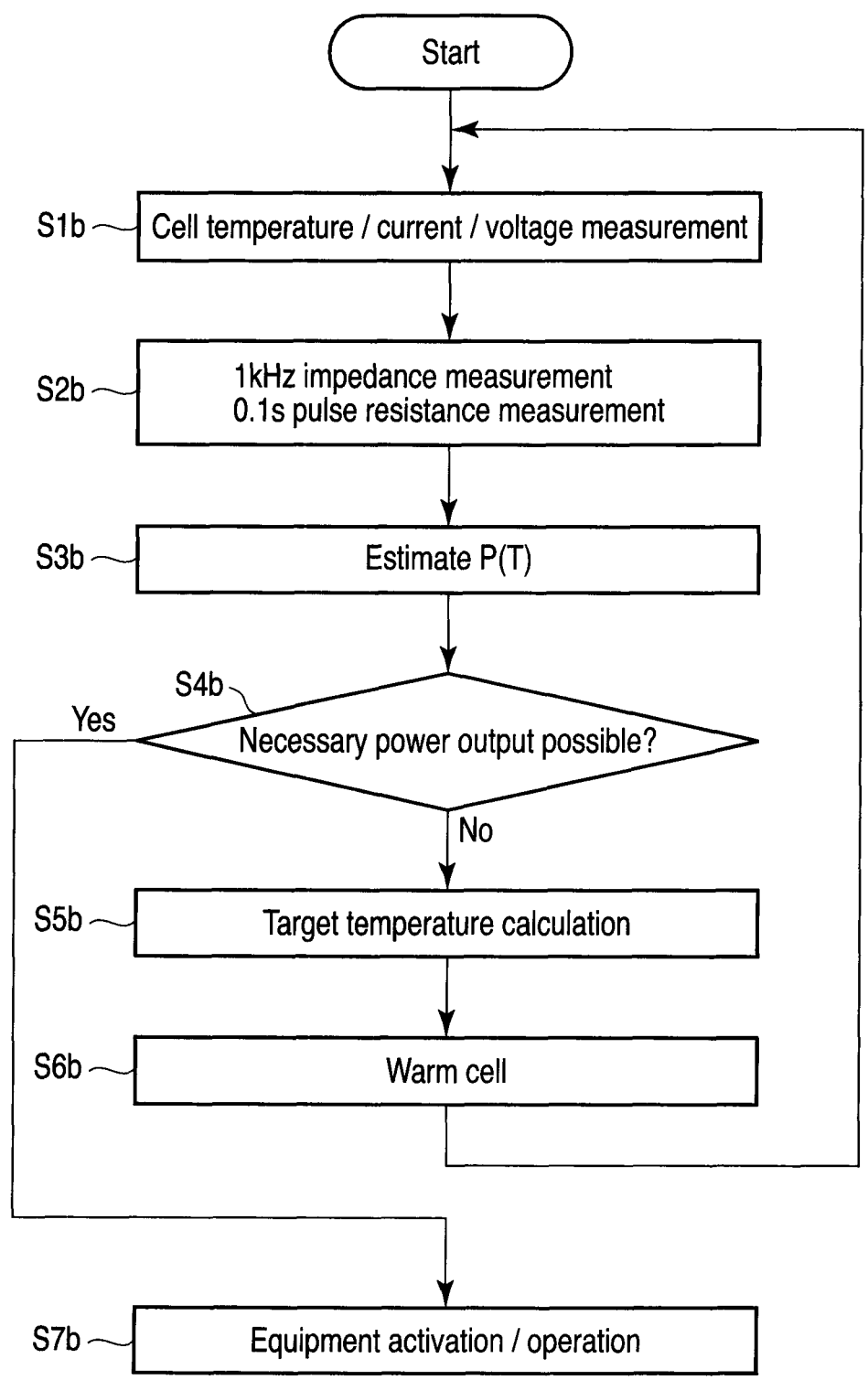
F I G. 7

BATTERY MEASURING DEVICE, BATTERY CONTROL SYSTEM AND VEHICLE

CROSS-REFERENCE TO RELATED APPLICATIONS

This application is based upon and claims the benefit of priority from prior Japanese Patent Application No. 2009-082993, filed Mar. 30, 2009, the entire contents of which are incorporated herein by reference.

BACKGROUND OF THE INVENTION

1. Field of the Invention

The present invention is related to, for example, a device for measuring performance of a secondary battery, a battery control system and vehicle.

2. Description of the Related Art

A nonaqueous electrolyte secondary battery typified by a lithium ion secondary battery has high energy density and is used as a power source of various mobile electronic devices. Further, in recent years, practical use of the secondary battery is being considered for hybrid vehicles, hybrid two-wheel vehicles, electric vehicles and electric motorcycles. Secondary batteries used for vehicles such as automobiles are required a battery life of 10 to 15 years likewise the automobile itself. Further, when the battery life is ended, it is necessary for the battery to have a minimum of capability to move the vehicle, instead of being unable to function at all. In other words, even at the time of reaching its end of lifetime, a secondary battery should maintain its capacity and be capable of exercising its minimum output.

Meanwhile, when using secondary batteries for vehicles, it is considered indispensable to run diagnostics of the degree of cell deterioration and performance prediction during a long term usage of over ten years. As an indicator for cell output deterioration, an internal resistance of a cell is suitable. If the internal resistance R of the cell is determined, a permissible current value Imax can be calculated. When an open circuit voltage of a cell is expressed as Voc, and a minimum value of usable voltage range is expressed as Vmin, a maximum output Pmax of the cell can be expressed as in the following equation.

$$P\max = V\min \times I\max = V\min \times (Voc - V\min)/R$$

Since the internal resistance R of the cell can be calculated from the change of cell voltage occurred upon changing the current value, it can be calculated by a resistance measuring device, such as a tester, or from current-voltage data upon cell usage. Further, means for conducting lifetime prediction by obtaining a resistance value of a battery is disclosed in, for example, JP-A 2000-133322 (KOKAI), JP-A 2001-119862 (KOKAI), and JP-A 2004-264076 (KOKAI).

However, since secondary batteries for vehicles are to be used outdoors throughout the four seasons, it should be taken into account that they would be used in a wide range of temperature from 30° C. below zero to as high as 40° C. Particularly, since cell output decreases under low temperature, it is necessary to accurately predict whether or not the batteries have output capacity which is usable for vehicles even under cold conditions. Accordingly, it is important that the method of measuring the state of cell deterioration also includes output characteristics of the cell under low temperature. However, since it is difficult to measure performance by actually obtaining a low temperature state, it was necessary to establish simple means for measuring internal resistance of a cell and predicting temperature change.

Further, in many cases, a particularly large amount of electricity is required when activating a vehicle or equipment. Therefore, the vehicle or equipment may be susceptible to the decrease in cell output under low temperature conditions. Different from the case of output fluctuation during operation, the temperature of a cell upon activation from a halted state is low. Further, a failure in start-up consumes large amount of energy uselessly. Even at present, there are cases in which start-up of vehicles fail in winter due to the decrease in battery output, and causes the battery to run out while repeating the start-up operation. Therefore, a method has been required such that resistance change of a cell caused by temperature is predicted accurately and energy stored in the cell is used effectively for reliable activation.

BRIEF SUMMARY OF THE INVENTION

According to an aspect of the present invention, it is provided that a battery measuring device includes: a temperature measuring unit which measures temperature T1 of a secondary battery; a resistance measuring unit which measures an AC resistance value and a DC pulse resistance value of a first discharging period of the secondary battery at the temperature T1; and an estimating unit in which an electric resistance Re1 and a reaction resistance Rc1 of the secondary battery at the temperature T1 are considered as, Re1=AC resistance value Rc1=DC pulse resistance value of first discharging period–AC resistance value, and which estimates at least an internal resistance of the secondary battery using the temperature T1, electric resistance Re1 and reaction resistance Rc1.

According to another aspect of the present invention, it is provided that a battery control system includes: the battery measuring device; and a deterioration determining unit which determines a deterioration condition of the secondary battery based on the reaction resistance Rc1.

According to another aspect of the present invention, it is provided that a vehicle includes the battery control system, and operates by power supplied from the secondary battery.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

FIG. 7 is a flow chart showing a warming-up process of the battery control system shown in FIG. 1.

DETAILED DESCRIPTION OF THE EMBODIMENT OF THE INVENTION

An embodiment of the present invention will be explained in detail by reference to the drawings as follows.

Figure 1:
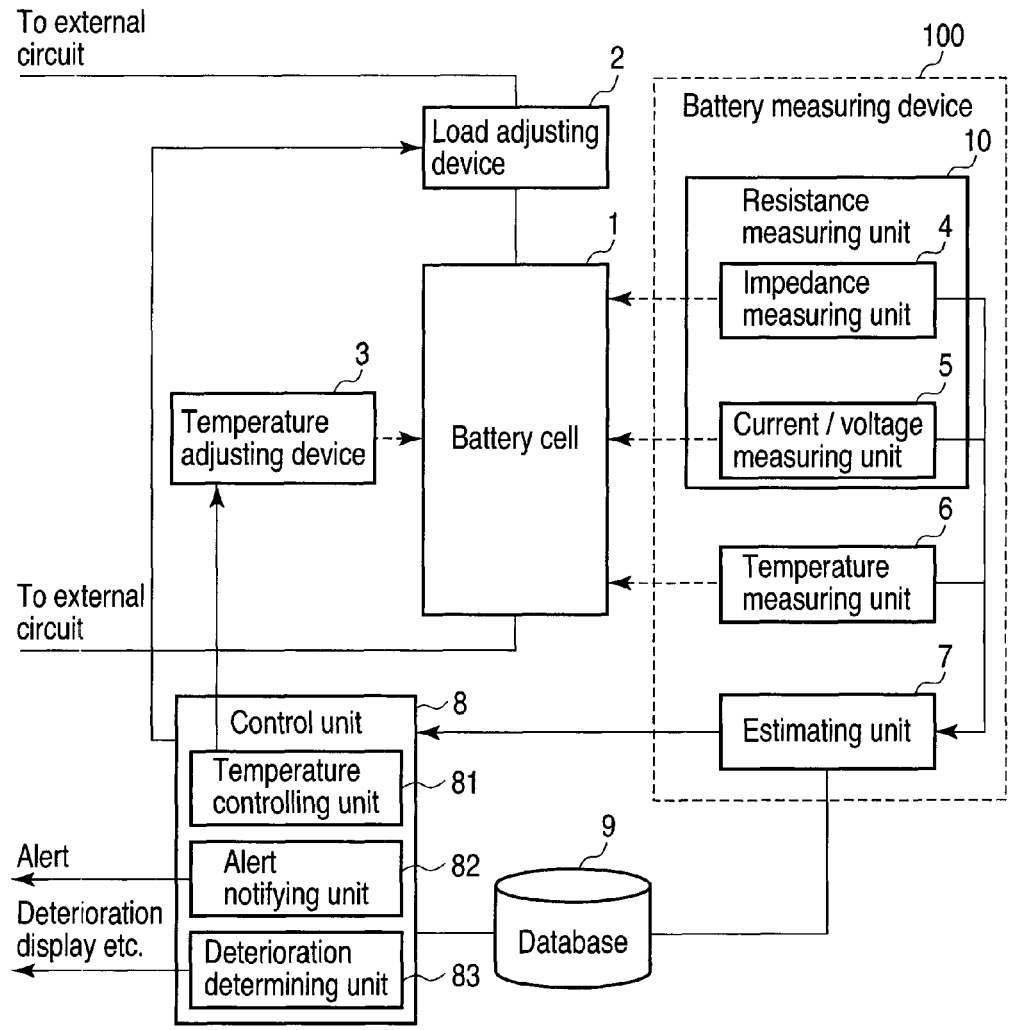
FIG. 1 is a functional block diagram showing a first embodiment of a battery control system according to the present invention.

FIG. 1 shows a configuration example of a battery control system according to a first embodiment of the present invention. This battery control system includes a battery measuring device 100 which evaluates a state of a battery cell 1, and a control unit 8 which controls each device. The battery cell 1 includes a battery pack using, for example, one or a plurality of nonaqueous electrolyte secondary batteries. The system further includes a load adjusting device 2 which adjusts a load current taken out from the battery cell 1, a temperature adjusting device 3 which adjusts operating temperature of the battery cell 1, a database 9 which has control information for controlling each device and equations etc. to be explained later stored in advance, and a display unit (drawing omitted). The control unit 8 has a temperature controlling unit 81, an alert notifying unit 82, and a deterioration determining unit 83.

The battery measuring device 100 includes a resistance measuring unit 10 which measures various resistance of the battery cell 1, a temperature measuring unit 6 which measures the temperature of the battery cell 1, and an estimating unit 7 which estimates internal resistance and output voltage etc. of the battery cell 1 using each value measured above. The resistance measuring unit 10 includes an impedance measuring unit 4 which measures AC resistance near 1 kHz of the battery cell 1, and a current/voltage measuring unit 5 which measures current/voltage of the battery cell 1. The resistance measuring unit 10 is capable of calculating DC0.1s resistance and DC10s resistance from a measured value of this current/voltage.

An operation of the battery control system configured in this manner will be explained as follows.

(Estimating Process of Cell Internal Resistance)

A battery suitable for the battery measuring device 100 of the present embodiment is a battery having high output density and high energy density and is structured in a manner that a positive electrode, a negative electrode and a separator are wound into a coil or stacked. For example, a nonaqueous electrolyte secondary battery typified by a lithium ion secondary battery and a nickel hydride secondary battery etc. can be cited. In the following, a case in which a lithium ion secondary battery is applied for the battery cell 1 will be explained.

As the temperature of the battery cell 1 becomes lower, the electrode reaction rate becomes slower, and lithium ion conductive property of an electrolytic solution weakens, causing the cell internal resistance to increase. Further, temperature dependence of the cell internal resistance changes with the progress in cell deterioration. This is because the cell internal resistance is a sum of several components, and deterioration rate and temperature dependence of each component differ. Therefore, in order to predict temperature dependence of the cell internal resistance, knowledge of separation and temperature dependence of each component is required. Broadly, as the component of the cell internal resistance, there are three components such as an electric resistance Re, a reaction resistance Rc and a diffusion resistance Rd.

It is difficult to separate the electric resistance Re, the reaction resistance Rc and the diffusion resistance Rd from each other only by simply measuring the internal resistance from a current-voltage response of the cell. It is necessary to perform electrochemistry measurement against the battery cell 1 using, for example, an AC impedance method.

Here, a measurement example of a lithium ion secondary battery will be mentioned as follows.

Figure 2:
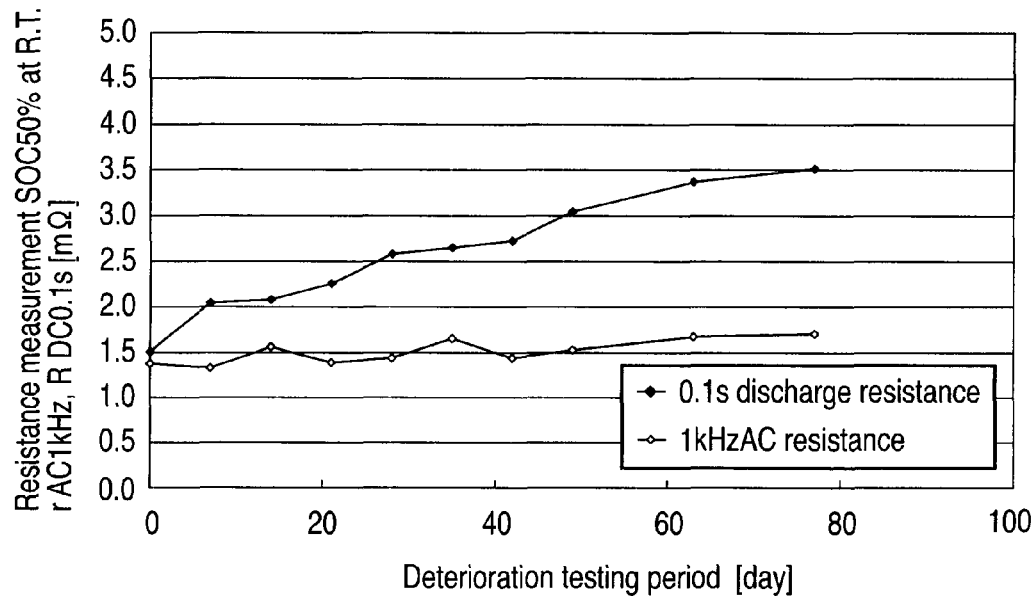
FIG. 2 shows an AC1 kHz resistance value and a DC0.1s resistance value of a lithium ion secondary battery under deterioration test.

FIG. 2 shows a transition of measurement results of an AC1 kHz resistance value and a DC0.1s resistance value of a battery under deterioration test when stored under high temperature. There are differences between the AC1 kHz resistance value and the Dc0.1s resistance value, in which an increase only in the DC0.1s resistance value can be observed due to deterioration.

Figure 3:
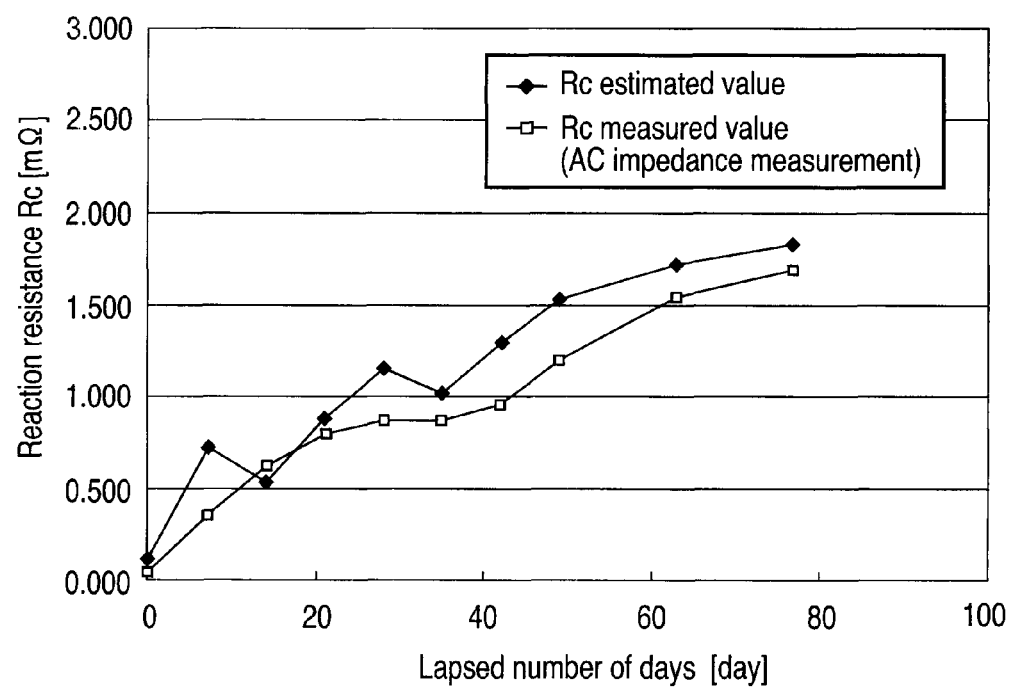
FIG. 3 shows an estimated value and a measured value of a reaction resistance.

FIG. 3 shows a plot of an estimated value when the reaction resistance Rc=DC0.1s resistance value—AC1 kHz resistance value, and a measured value of the reaction resistance Rc measured by the AC impedance method. According to FIG. 3, it is recognized that both the estimated value and the measured value of the Rc have approximately the same increasing tendency caused by size and deterioration.

Therefore, in the present embodiment, the AC resistance value, the DC0.1s resistance value and the DC10s resistance value, which can be measured easily near 1 kHz, are respectively measured, to define that the AC1 kHz resistance value is the electric resistance Re, a value which is obtained by subtracting the AC1 kHz from the DC0.1s resistance value is the reaction resistance Rc, and a value obtained by subtracting the DC0.1s resistance value from the DC10s resistance value is the diffusion resistance Rd, as is shown in the following equation.

$$Re1 = AC1 \text{ kHz resistance value}$$

$$Rc1 = DC0.1s \text{ resistance value} - AC1 \text{ kHz resistance value}$$

$$Rd = DC10s \text{ resistance value} - DC0.1s \text{ resistance value}$$

Each resistance component has the following characteristics.

(1) The electric resistance Re is mainly an ion conductive resistance of electrolytic solution, which increases less by deterioration and has a moderate temperature dependency.

(2) The reaction resistance Rc is a reaction resistance of a battery electrode reaction, which increases by deterioration and has a significantly large temperature dependency.

(3) The diffusion resistance Rd is a diffusion resistance of a lithium ion, which barely changes due to deterioration and which can mostly ignore temperature dependency compared to the other two resistances.

Further, the measuring method of each resistance value is preferred to be set as follows according to battery characteristics.

For the value of Re, it is preferred to use AC resistance in the range of 2 k to 100 Hz.

For the value of Re+Rc, it is preferred to use DC pulse resistance value in the range of 0.05 to 3 s.

For the value of Re+Rc+Rd, it is preferred to use DC pulse resistance value in the range of 5 to 30 s.

Accordingly, a temperature change constant necessary for obtaining the cell internal resistance in the battery measuring device 100 of the present embodiment is the temperature dependencies of the reaction resistance Rc and the electric resistance Re. As a result of discussing the change of Rc and Re caused by cell deterioration and temperature by the AC impedance method, the following relation is established. Further, a result such that $E_C$ and $E_E$ do not change in the process of cell deterioration is obtained.

$$Rc = 1/(A \times \exp(-E_{C/RT}))$$

$$Re = 1/(A \times \exp(-E_E/RT)) + \text{const.}$$

Figure 4:
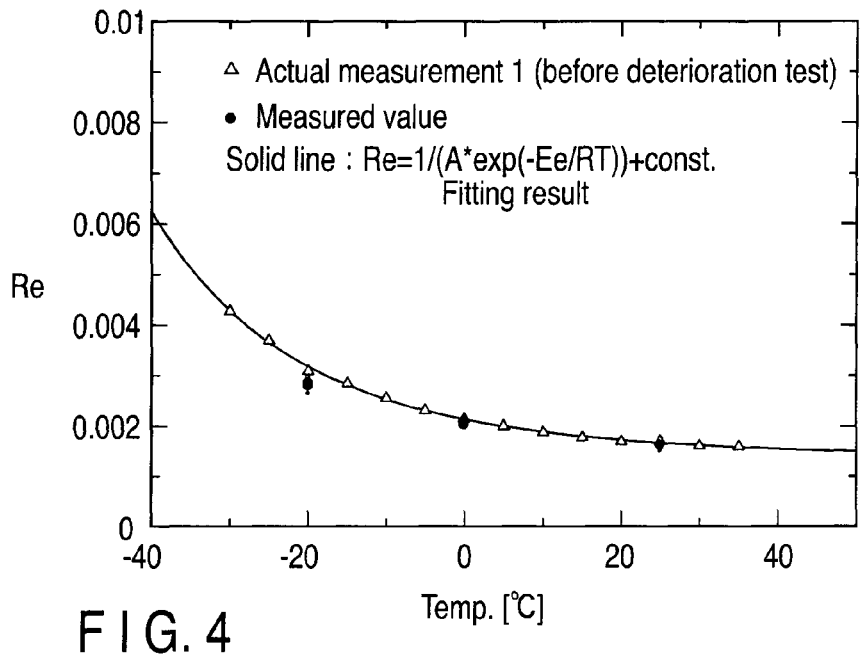
FIG. 4 shows a measured value and a fitting result of an electric resistance.

Constants $E_C$ and $E_E$ differ in accordance with the type of battery. They can be obtained in the following manner, by changing the temperature of the battery cell 1 and measuring the reaction resistance Rc and the simple Re by AC impedance measurement at approximately five to ten different temperatures, and fitting the measured results in the relational expression mentioned earlier. FIG. 4 shows a plot of the Re measured value and the fitting result obtaining the constant $E_E$ from this plot. Actual measurement 1 is a result of a measurement conducted to obtain the constant $E_E$ before the cell deterioration test. The measured value is a value of Re measured during the deterioration test. Further, it can be observed from FIG. 4 that the value of Re does not change even if deterioration progresses.

Accordingly, when a reaction resistance and an electric resistance measured at a certain temperature T1 is respectively Rc1 and Re1, resistance values Rc (T) and Re (T) at an arbitrary temperature can be expressed as follows.

$$Rc(T) = Rc1 \times \{\exp(-E_C/RT1)/\exp(-E_C/RT)\}$$

$$Re(T) = Re1 \times \{\exp(-E_E/RT1)/\exp(-E_E/RT)\} + \text{const.}$$

A resistance value R(T) of the battery cell 1 at an arbitrary temperature T can be obtained as follows, by obtaining in advance Rc1, Re1 and Rd at the certain temperature T1 from the resistance measurement result of a battery in use, AC1 kHz resistance value, DC0.1s resistance value and DC10s resistance value using constants $E_C$ and $E_E$ specific to the battery cell 1 by the means mentioned above, and using the values of temperature T1, Rc1, Re1 and Rd. Further, it is preferred to store in a database 9 in advance values of constants $E_C$ and $E_E$ and the diffusion resistance Rd, which can mostly ignore temperature dependency, obtained in advance by the above means.

$$\begin{aligned} R(T) &= Re(T) + Rc(T) + Rd \\ &= Re1 \times \{\exp(-E_E/RT1)/\exp(-E_E/RT)\} + \\ &\quad Rc1 \times \{\exp(-E_C/RT1)/\exp(-E_C/RT)\} + Rd \end{aligned}$$

Figure 5:
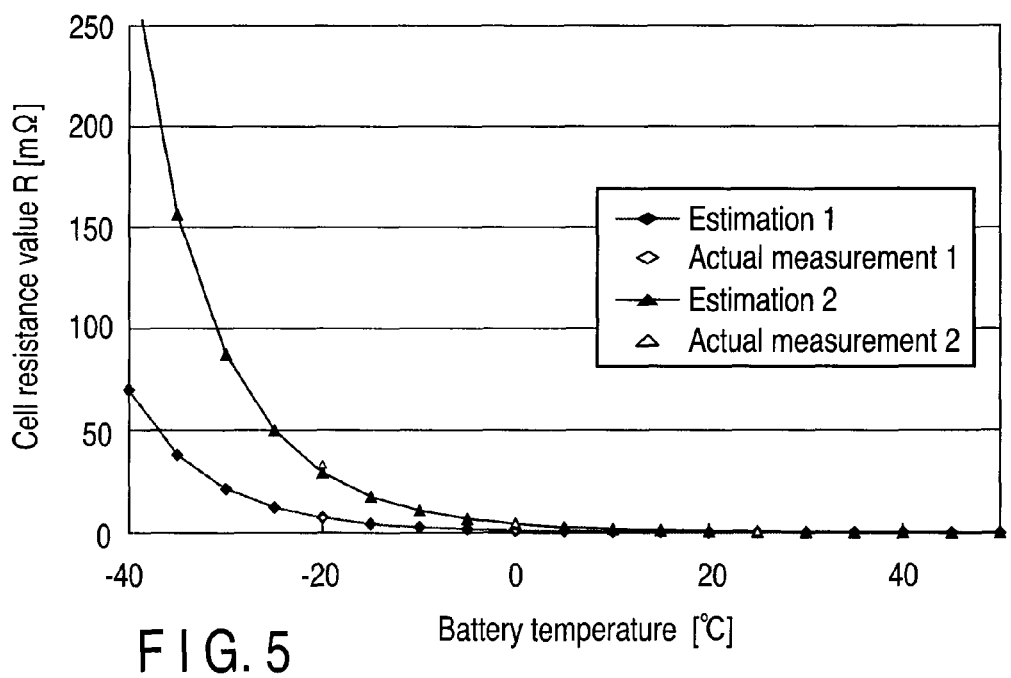
FIG. 5 shows an estimated value and measured value of an internal resistance of a cell.

FIG. 5 shows a plot of a result of estimating temperature characteristics of the cell internal resistance by the above equation and the measured value. Estimation 1 and actual measurement 1 indicate initial values (before deterioration test), and estimation 2 and actual measurement 2 indicate values during deterioration test (after lapse of 30 days). The estimation value and the measured value can be confirmed to match.

Further, the maximum output power P(T) of the battery cell 1 at temperature T can be calculated as follows from the value R(T) obtained in the above manner, when an open circuit voltage is expressed as Voc and minimum value of a usable voltage range is expressed as Vmin in the secondary battery.

$$P(T) = V\min \times (Voc - V\min)/R(T)$$

In the present battery control system, the temperature measuring unit 6 measures the temperature T of the battery cell 1, and the resistance measuring unit 10 includes an AC resistance measuring terminal and a DC resistance measuring terminal, and measures the AC1 kHz resistance value, the DC0.1s resistance value and the DC10s resistance value of the battery cell 1. Each measured value is sent to the estimating unit 7. The estimating unit 7 has a program to simulate the cell internal resistance R(T) and the maximum output power P(T) of the battery cell 1 by the equation mentioned above.

(Alert Notifying Process)

Figure 6:
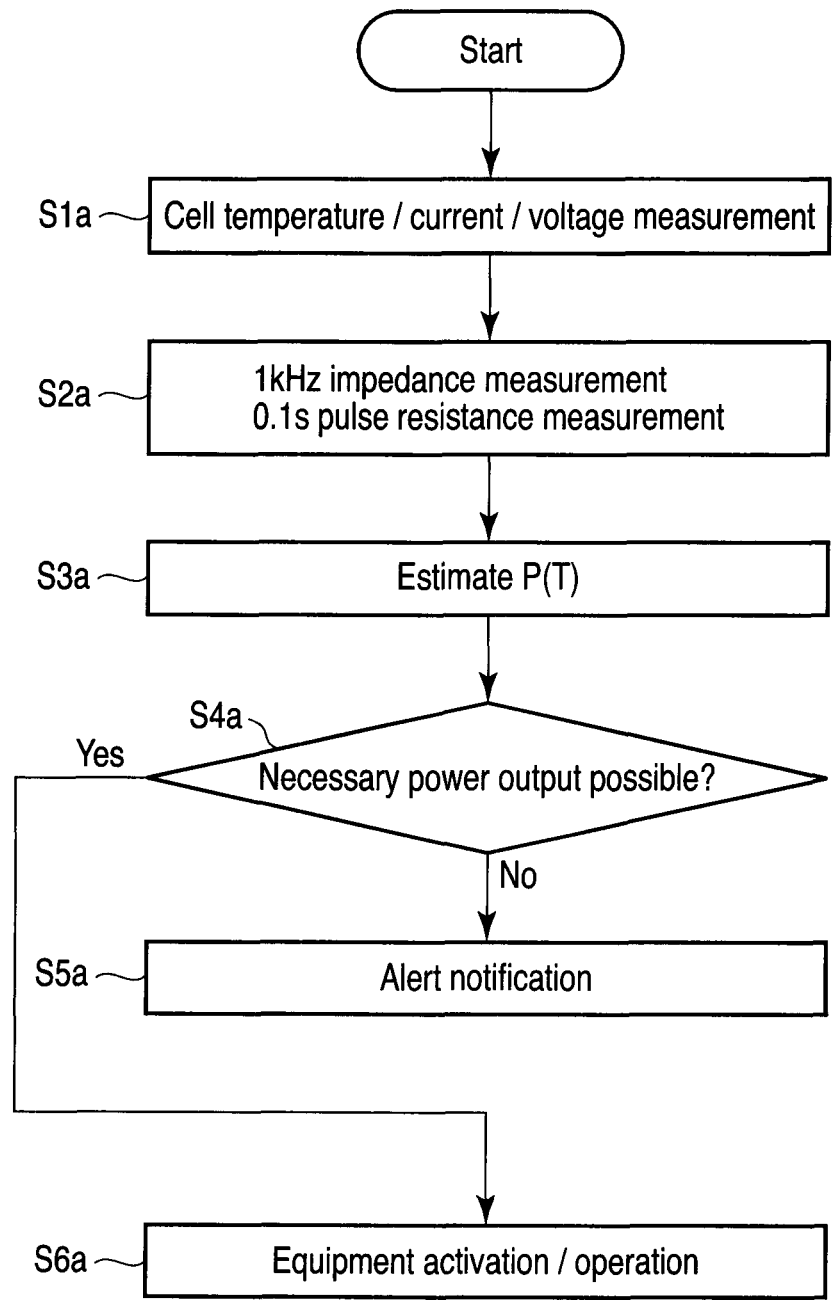
FIG. 6 is a flow chart showing an alert notifying process of the battery control system shown in FIG. 1.

FIG. 6 is a flow chart showing an operation at start-up of the battery control system. Further, the present system supplies power to vehicles or equipments. When the present system is activated, the temperature measuring unit 6 measures a temperature T of the battery cell 1, and the current/voltage measuring unit 5 measures the current/voltage of the battery cell 1 (step S1a). The resistance measuring unit 10 measures the AC1 kHz resistance value, DC0.1s resistance value and the DC10s resistance value of the battery cell 1 (step S2a). The estimating unit 7 estimates a cell maximum output power P (T) based on each value measured above using the above equation (step S3a).

The alert notifying unit 82 determines whether or not necessary power can be output to the equipment based on the estimated cell maximum output power P (T) (step S4a). When the alert notifying unit 82 determines that the battery cell 1 is capable of outputting necessary power at the current temperature (step S4a: Yes), the control unit 8 activates the equipment and starts operation (step S6a). Meanwhile, if the alert notifying unit 82 determines that the battery cell 1 is incapable of outputting necessary power at the current temperature (step S4a: No), it displays alert or issues an alarm etc (step S5a).

It is determined that the necessary output power is unmet in the following manner. That is, when a relation such as, power necessary for activating or operating the equipment>maximum output P (T) of the battery at the current temperature, is established for the current maximum output P (T) of the cell at temperature T, the battery cell 1 is determined as incapable of satisfying the necessary output power. By storing "power necessary for activating or operating the equipment" in the database 9 in advance, it can be arbitrarily referred upon in accordance with need such as in the case of conducting the above determining process.

The above alert notification prevents large amount of energy from being consumed uselessly due to failure in activation, and allows energy stored in a battery cell to be used effectively to enable activation without fail.

(Warming-Up Process)

Further, in the case where there is not enough output power for activation, a function to warm-up the battery cell up to a driving temperature which allows the vehicle or equipment to be activated is executed.

FIG. 7 is a flow chart showing the warm-up operation upon start-up of the battery control system. Further, since steps S1b to S4b are the same processes as those of steps S1a to S4a of FIG. 6, detailed explanations will be omitted.

When the present system is activated, the temperature measuring unit 6 measures the temperature T of the battery cell 1, and the current/voltage measuring unit 5 measures the current/voltage of the battery cell 1 (step S1b). The resistance measuring unit 10 measures the AC1 kHz resistance value, DC0.1s resistance value and the DC10s resistance value of the battery cell 1 (step S2b). The estimating unit 7 estimates a cell maximum output power P (T) based on each value measured above using the above equation (step S3b). The temperature controlling unit 81 determines whether or not necessary power can be output to the equipment based on the estimated cell maximum output power P (T) (step S4b).

When the temperature controlling unit 81 determines that the battery cell 1 is incapable of outputting necessary power at the current temperature (step S4b: No), it calculates a target temperature at which necessary power could be output based on each value measured above, using the above equation (step S5b). The temperature controlling unit 81 gives instructions to the temperature adjusting device 3, which warms the battery cell 1 until it reaches the target temperature (step S6b). When the temperature controlling unit 81 determines that the temperature of the battery cell 1 has reached the target temperature and that standard power can be output (step S4b: Yes), the control unit 8 activates the equipment and starts operation (step S7b). Further, the battery control system can make the processes of steps S1b to 6b of FIG. 7 performed repeatedly during operation.

Since the above processes automatically warms up a vehicle or equipment to an operating temperature which allows activation, it is capable to ensure activation without causing failure of start-up.

(Deterioration Determining Process)

Figure 8:
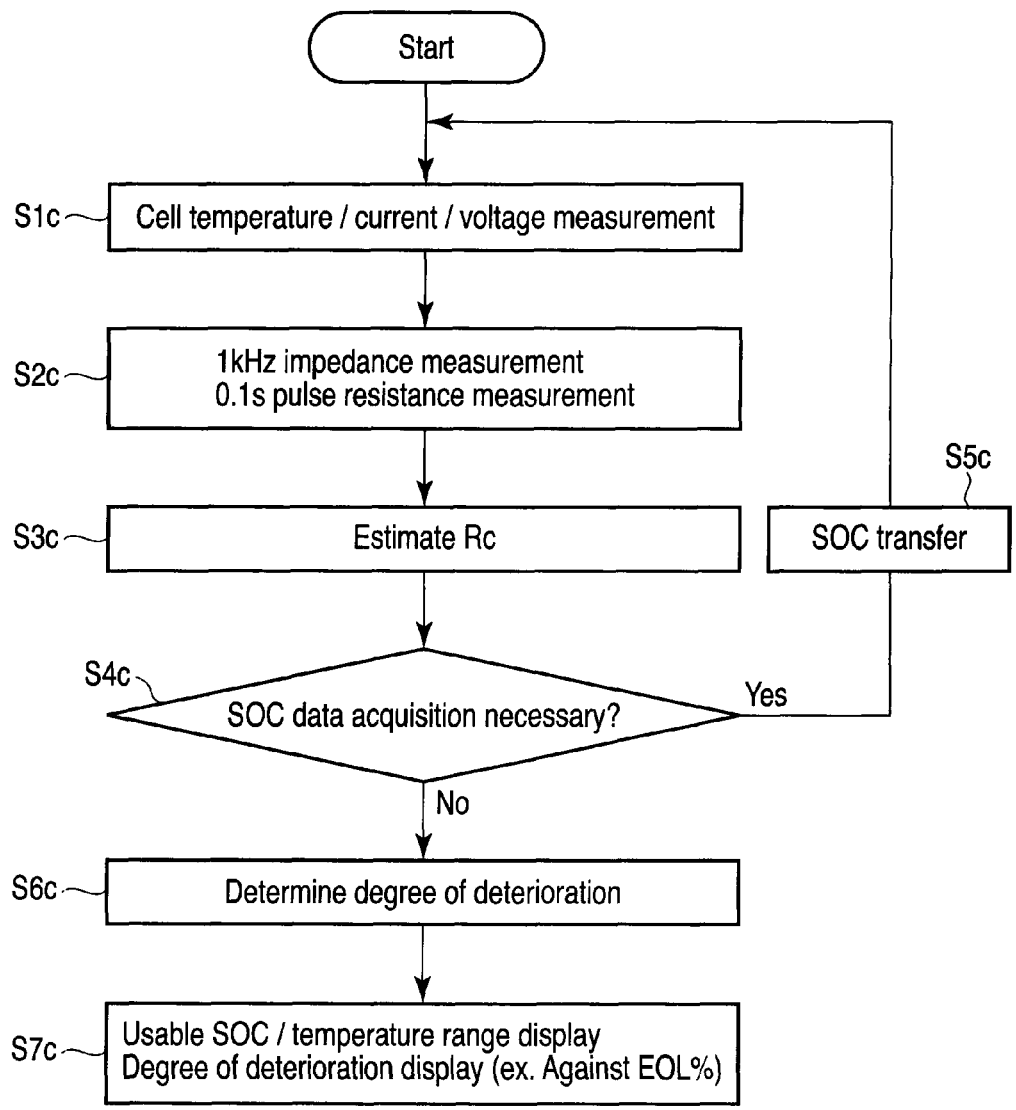
FIG. 8 is a flow chart showing a deterioration determining process of the battery control system shown in FIG. 1.

FIG. 8 is a flow chart showing an operation of a deterioration determining process of the battery control system. The temperature measuring unit 6 measures the temperature of the battery cell 1, and the current/voltage measuring unit 5 measures the current/voltage of the battery cell 1 (step S1c). The resistance measuring unit 10 measures the AC1 kHz resistance value and the DC0.1s resistance value of the battery cell 1 (step S2c). The estimating unit 7 estimates a reaction resistance Rc based on each value measured above using the above equation (step S3c).

Since it is that, in the state of charge (SOC) of the battery between 0 to 100%, battery cannot be discharged when the amount of charge is around 0%, and battery cannot be charged when the amount of charge is around 100%, the areas around the amount of charge of 0% and 100% have large resistance. Therefore, in such areas necessary output power cannot be obtained. Since these areas stretch out as the battery deteriorates, in some cases, it may be necessary to acknowledge the range of usable SOC for battery control, such as, that necessary output power can be obtained if between SOC 20 to 80%. Therefore, the following operation can be conducted.

In the case where the deterioration determining unit 83 needs to obtain further SOC data (step S4c: Yes), it repeats the processes from step S1c after SOC is transferred (step S5c). Since the value of reaction resistance Rc changes due to SOC, measurement is conducted by changing the SOC, for example, in the order of 20%, 40%, 60% and 80%. In the case where there is no need to obtain the SOC data, or when acquisition of SOC data has been completed (step S4c: No), the deterioration determining unit 83 determines the degree of deterioration based on the estimated value of the above reaction resistance Rc (step S6c). As shown in the above FIG. 3, the reaction resistance Rc tend to increase by deterioration. The deterioration determining unit 83 is capable of obtaining end of life (EOL %) for the battery cell 1 from the ratio between, for example, the reaction resistance Rc estimated above and the Rc value set as a lifetime of the battery cell 1. The deterioration determining unit 83 displays the range of usable SOC based on the determination result, displays usable temperature range, or displays the degree of deterioration against EOL % etc (step S7c).

As mentioned above, the battery measuring device of the above embodiment measures AC1 kHz resistance value, DC0.1s resistance value and DC10s resistance value, which can be easily measured, and estimates the cell internal resistance and the maximum output power at an arbitrary temperature using these measured values. In this manner, for example, the performance of the secondary battery under low temperature can be obtained easily, making it possible to accurately predict whether or not the secondary battery would be usable under cold conditions.

Further, the above battery control system notifies alert in the case where it cannot satisfy necessary outputs of the vehicle and equipment based on the estimation result, and executes a function to warm the battery cell up to an operation temperature in which the wheel vehicle or equipment can be activated. Furthermore, the deterioration condition of the battery cell can be estimated with high accuracy to enable the lifetime to be diagnosed appropriately. This enables stable operation of vehicles or equipment which operates by power supplied from a secondary battery.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A battery control device comprising:

a temperature measuring unit which measures temperature T1 of a secondary battery;

a resistance measuring unit which measures an AC resistance value and a DC pulse resistance value of a first discharging period of the secondary battery at the temperature T1; and an estimating unit in which an electric resistance Re1 and a reaction resistance Rc1 of the secondary battery at the temperature T1 are considered as, Re1=AC resistance value Rc1=DC pulse resistance value of the first discharging period minus AC resistance value, and which estimates at least an internal resistance of the secondary battery using the temperature T1, the electric resistance Re1 and the reaction resistance Rc1, wherein the estimating unit uses constants EC and EE specific to the secondary battery to estimate an electric resistance Re (T) and a reaction resistance Rc (T) of the secondary battery at an arbitrary temperature T as, $Re(T)=Re1\times\{\exp(-EE/RT1)/\exp(-EE/RT)\}$ $Rc(T)=Rc1\times\{\exp(-EC/RT1)/\exp(-EC/RT)\}$, wherein the resistance measuring unit measures a DC pulse resistance value of a second discharging period which is longer than the first discharging period of the secondary battery at the temperature T1, and the estimating unit estimates a diffusion resistance Rd of the secondary battery at the temperature T1 as, Rd=DC pulse resistance value of the second discharging period minus DC pulse resistance value of the first discharging period, and an internal resistance R (T) of the secondary battery at the arbitrary temperature T as, $R(T)=Re(T)+Rc(T)+Rd$, wherein the estimating unit uses an open circuit voltage Voc and a minimum value Vmin of a usable voltage range of the secondary battery to estimate a maximum output power P (T) of the secondary battery at the temperature T as, $P(T)=V\min\times(Voc-V\min)/R(T)$, wherein the estimating unit determines that, in a case where the maximum output power P (T) is smaller than a predetermined reference value, the secondary battery does not satisfy necessary power output, an alert notifying unit which issues an alert in a case where the maximum output power P (T) is determined as unable to satisfy the predetermined reference value.

2. A battery control system comprising:
a battery measuring device comprising a temperature measuring unit which measures temperature T1 of a secondary battery; a resistance measuring unit which measures an AC resistance value and a DC pulse resistance value of a first discharging period of the secondary battery at the temperature T1; and an estimating unit in which an electric resistance Re1 and a reaction resistance Rc1 of the secondary battery at the temperature T1 are considered as,
Re1=AC resistance value
Rc1=DC pulse resistance value of the first discharging period minus AC resistance value, and which estimates at least an internal resistance of the secondary battery using the temperature T1, the electric resistance Re1 and the reaction resistance Rc1; and
a deterioration determining unit which determines a deterioration condition of the secondary battery based on the reaction resistance Rc1.

3. The battery control system according to claim 2, wherein in the battery measuring device
the estimating unit uses constants EC and EE specific to the secondary battery to estimate an electric resistance Re (T) and a reaction resistance Rc (T) of the secondary battery at an arbitrary temperature T as, $Re(T)=Re1\times\{\exp(-EE/RT1)/\exp(-EE/RT)\}$ $Rc(T)=Rc1\times\{\exp(-EC/RT1)/\exp(-EC/RT)\}.$ 4. The battery control system according to claim 3, wherein in the battery measuring device
the resistance measuring unit measures a DC pulse resistance value of a second discharging period which is longer than the first discharging period of the secondary battery at the temperature T1, and
the estimating unit estimates a diffusion resistance Rd of the secondary battery at the temperature T1 as,
Rd=DC pulse resistance value of the second discharging period minus DC pulse resistance value of the first discharging period, and
an internal resistance R (T) of the secondary battery at the arbitrary temperature T as, $R(T)=Re(T)+Rc(T)+Rd.$ 5. The battery control system according to claim 4, wherein in the battery measuring device
the estimating unit uses an open circuit voltage Voc and a minimum value Vmin of a usable voltage range of the secondary battery to estimate a maximum output power P (T) of the secondary battery at the temperature T as, $P(T)=V\min\times(Voc-V\min)/R(T).$ 6. The battery control system according to claim 5, wherein in the battery measuring device
the estimating unit determines that, in a case where the maximum output power P (T) is smaller than a predetermined reference value, the secondary battery does not satisfy necessary power output.

7. A battery control system comprising:
a temperature measuring unit which measures temperature T1 of a secondary battery;
a resistance measuring unit which measures an AC resistance value and a DC pulse resistance value of a first discharging period of the secondary battery at the temperature T1; and an estimating unit in which an electric resistance Re1 and a reaction resistance Rc1 of the secondary battery at the temperature T1 are considered as,
Re1=AC resistance value
Rc1=DC pulse resistance value of the first discharging period minus AC resistance value, and which estimates at least an internal resistance of the secondary battery using the temperature T1, the electric resistance Re1 and the reaction resistance Rc1,
wherein the estimating unit uses constants EC and EE specific to the secondary battery to estimate an electric resistance Re (T) and a reaction resistance Rc (T) of the secondary battery at an arbitrary temperature T as, $Re(T)=Re1\times\{\exp(-EE/RT1)/\exp(-EE/RT)\}$ $Rc(T)=Rc1\times\{\exp(-EC/RT1)/\exp(-EC/RT)\},$ wherein the resistance measuring unit measures a DC pulse resistance value of a second discharging period which is longer than the first discharging period of the secondary battery at the temperature T1, and
the estimating unit estimates a diffusion resistance Rd of the secondary battery at the temperature T1 as,
Rd=DC pulse resistance value of the second discharging period minus DC pulse resistance value of the first discharging period, and
an internal resistance R (T) of the secondary battery at the arbitrary temperature T as, $R(T)=Re(T)+Rc(T)+Rd,$ wherein the estimating unit uses an open circuit voltage Voc and a minimum value Vmin of a usable voltage range of the secondary battery to estimate a maximum output power P (T) of the secondary battery at the temperature T as, $P(T)=V\min\times(Voc-V\min)/R(T),$ wherein the estimating unit determines that, in a case where the maximum output power P (T) is smaller than a predetermined reference value, the secondary battery does not satisfy necessary power output,
a temperature adjusting device which adjusts temperature of the secondary battery; and
a temperature control unit which has the temperature adjusting device warm the secondary battery until the maximum output power P (T) reaches the predetermined reference value.

8. A vehicle comprising a battery control system comprising:
a battery measuring device comprising a temperature measuring unit which measures temperature T1 of a secondary battery; a resistance measuring unit which measures an AC resistance value and a DC pulse resistance value of a first discharging period of the secondary battery at the temperature T1; and
an estimating unit in which an electric resistance Re1 and a reaction resistance Rc1 of the secondary battery at the temperature T1 are considered as,
Re1=AC resistance value
Rc1=DC pulse resistance value of the first discharging period minus AC resistance value, and which estimates at least an internal resistance of the secondary battery using the temperature T1, the electric resistance Re1 and the reaction resistance Rc1; and
a deterioration determining unit which determines a deterioration condition of the secondary battery based on the reaction resistance Rc1, wherein the vehicle operates by power supplied from the secondary battery.

9. A vehicle comprising a battery control device comprising:
   a temperature measuring unit which measures temperature T1 of a secondary battery;
   a resistance measuring unit which measures an AC resistance value and a DC pulse resistance value of a first discharging period of the secondary battery at the temperature T1; and
   an estimating unit in which an electric resistance Re1 and a reaction resistance Rc1 of the secondary battery at the temperature T1 are considered as,
   Re1=AC resistance value
   Rc1=DC pulse resistance value of the first discharging period minus AC resistance value, and which estimates at least an internal resistance of the secondary battery using the temperature T1, the electric resistance Re1 and the reaction resistance Rc1,
   wherein the estimating unit uses constants EC and EE specific to the secondary battery to estimate an electric resistance Re (T) and a reaction resistance Rc (T) of the secondary battery at an arbitrary temperature T as, $Re(T)=Re1\times\{\exp(-EE/RT1)/\exp(-EE/RT)\}$ $Rc(T)=Rc1\times\{\exp(-EC/RT1)/\exp(-EC/RT)\}$, wherein the resistance measuring unit measures a DC pulse resistance value of a second discharging period which is longer than the first discharging period of the secondary battery at the temperature T1, and
   the estimating unit estimates a diffusion resistance Rd of the secondary battery at the temperature T1 as,
   Rd=DC pulse resistance value of the second discharging period minus DC pulse resistance value of the first discharging period, and
   an internal resistance R (T) of the secondary battery at the arbitrary temperature T as, $R(T)=Re(T)+Rc(T)+Rd$, wherein the estimating unit uses an open circuit voltage Voc and a minimum value Vmin of a usable voltage range of the secondary battery to estimate a maximum output power P (T) of the secondary battery at the temperature T as, $P(T)=V\min\times(Voc-V\min)/R(T)$, wherein the estimating unit determines that, in a case where the maximum output power P (T) is smaller than a predetermined reference value, the secondary battery does not satisfy necessary power output,
   an alert notifying unit which issues an alert in a case where the maximum output power P (T) is determined as unable to satisfy the predetermined reference value,
   wherein the vehicle operates by power supplied from the secondary battery.

10. A vehicle comprising a battery control system comprising:
   a temperature measuring unit which measures temperature T1 of a secondary battery;
   a resistance measuring unit which measures an AC resistance value and a DC pulse resistance value of a first discharging period of the secondary battery at the temperature T1; and
   an estimating unit in which an electric resistance Re1 and a reaction resistance Rc1 of the secondary battery at the temperature T1 are considered as,
   Re1=AC resistance value
   Rc1=DC pulse resistance value of the first discharging period minus AC resistance value, and which estimates at least an internal resistance of the secondary battery using the temperature T1, the electric resistance Re1 and the reaction resistance Rc1,
   wherein the estimating unit uses constants EC and EE specific to the secondary battery to estimate an electric resistance Re (T) and a reaction resistance Rc (T) of the secondary battery at an arbitrary temperature T as, $Re(T)=Re1\times\{\exp(-EE/RT1)/\exp(-EE/RT)\}$ $Rc(T)=Rc1\times\{\exp(-EC/RT1)/\exp(-EC/RT)\}$, wherein the resistance measuring unit measures a DC pulse resistance value of a second discharging period which is longer than the first discharging period of the secondary battery at the temperature T1, and
   the estimating unit estimates a diffusion resistance Rd of the secondary battery at the temperature T1 as,
   Rd=DC pulse resistance value of the second discharging period minus DC pulse resistance value of the first discharging period, and
   an internal resistance R (T) of the secondary battery at the arbitrary temperature T as, $R(T)=Re(T)+Rc(T)+Rd$, wherein the estimating unit uses an open circuit voltage Voc and a minimum value Vmin of a usable voltage range of the secondary battery to estimate a maximum output power P (T) of the secondary battery at the temperature T as, $P(T)=V\min\times(Voc-V\min)/R(T)$, wherein the estimating unit determines that, in a case where the maximum output power P (T) is smaller than a predetermined reference value, the secondary battery does not satisfy necessary power output,
   a temperature adjusting device which adjusts temperature of the secondary battery; and
   a temperature control unit which has the temperature adjusting device warm the secondary battery until the maximum output power P (T) reaches the predetermined reference value,
   wherein the vehicle operates by power supplied from the secondary battery.

* * * * *